United States Patent
Xiong et al.

(10) Patent No.: US 10,672,953 B2
(45) Date of Patent: *Jun. 2, 2020

(54) FLIP-CHIP LIGHT EMITTING DIODE CHIP AND FABRICATION METHOD

(71) Applicant: XIAMEN SANAN OPTOELECTRONICS TECHNOLOGY CO., LTD., Xiamen (CN)

(72) Inventors: Weiping Xiong, Xiamen (CN); Shu-fan Yang, Xiamen (CN); Meijia Yang, Xiamen (CN); Chun-Yi Wu, Xiamen (CN); Chaoyu Wu, Xiamen (CN); Duxiang Wang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/666,661

(22) Filed: Oct. 29, 2019

(65) Prior Publication Data

US 2020/0066940 A1    Feb. 27, 2020

Related U.S. Application Data

(63) Continuation of application No. 15/859,601, filed on Dec. 31, 2017, now Pat. No. 10,497,837, which is a (Continued)

(30) Foreign Application Priority Data

May 20, 2016 (CN) .......................... 2016 1 0336713

(51) Int. Cl.
*H01L 33/00* (2010.01)
*H01L 21/00* (2006.01)
(Continued)

(52) U.S. Cl.
CPC .......... *H01L 33/44* (2013.01); *H01L 33/0079* (2013.01); *H01L 33/22* (2013.01); *H01L 33/405* (2013.01); *H01L 2933/0025* (2013.01)

(58) Field of Classification Search
CPC ..................................................... H01L 33/405
(Continued)

(56) References Cited

U.S. PATENT DOCUMENTS 10,050,181 B2 *  8/2018  Meng ..................... H01L 33/405
10,497,837 B2 * 12/2019  Xiong ..................... H01L 33/44
                                                                 257/98

* cited by examiner

*Primary Examiner* — Calvin Lee
(74) *Attorney, Agent, or Firm* — Syncoda LLC; Feng Ma

(57) ABSTRACT

A light-emitting diode (LED) includes an epitaxial laminated layer with an upper surface and an opposing lower surface, the LED including: a first-type semiconductor layer; an active layer; and a second-type semiconductor layer. A portion of the first-type semiconductor layer and the active layer are etched to expose a portion of the second-type semiconductor layer; a first electrode and a second electrode are disposed over the lower surface of the epitaxial laminated layer; the first electrode is disposed over a surface of the first-type semiconductor layer; the second electrode is disposed over a surface of the exposed second-type semiconductor layer; a transparent medium layer over the upper surface of the epitaxial laminated layer, having a refractive index $n_1 > 1.6$; a transparent bonding medium layer over one upper surface of the transparent medium layer, having a refractive index $n_2 < n_1$.

20 Claims, 4 Drawing Sheets

Related U.S. Application Data continuation of application No. PCT/CN2017/082170, filed on Apr. 27, 2017.

(51) Int. Cl.
  *H01L 33/44* (2010.01)
  *H01L 33/22* (2010.01)
  *H01L 33/40* (2010.01)

(58) Field of Classification Search
  USPC .................................. 438/29, 31, 44; 257/98
  See application file for complete search history.

FLIP-CHIP LIGHT EMITTING DIODE CHIP AND FABRICATION METHOD

CROSS-REFERENCE TO RELATED APPLICATIONS

The present application is a continuation of, and claims priority to, U.S. patent application Ser. No. 15/859,601 filed on Dec. 31, 2017, which is a continuation of International Application No. PCT/CN2017/082170 filed on Apr. 27, 2017, which claims priority to Chinese Patent Application No. 2016/10336713.4 filed on May 20, 2016. The disclosures of these applications are hereby incorporated by reference in their entirety.

BACKGROUND

Flip-chip light-emitting diodes are effective technical means to further improve light-emitting efficiency of the light-emitting diode thanks to free of wiring, free of electrode shielding and good heat dissipation.

SUMMARY

The inventors of the present disclosure have recognized that existing AlGaInP quaternary materials for fabricating red-light and yellow-light LEDs with high power and high luminance are mainly light-absorbing GaAs substrate materials. To fabricate a high-luminance flip-chip LED chip, it may need to be transferred to a transparent substrate and light must be effectively extracted to improve external quantum efficiency.

The present disclosure provides a flip-chip light-emitting diode chip with a patterned transparent bonding layer and fabrication method thereof, wherein, the patterned transparent bonding layer can guarantee bonding quality and improve light extraction efficiency of the flip-chip light-emitting diode chip.

According to a first aspect of the present disclosure, a flip-chip light-emitting diode chip includes: an epitaxial laminated layer, having an upper surface and a lower surface opposite to each other, including an n-type semiconductor layer, an active layer and a p-type semiconductor layer, wherein, part of the n-type semiconductor layer and the active layer are etched to expose part of the p-type semiconductor layer; a first electrode and a second electrode over the lower surface of the epitaxial laminated layer, wherein, the first electrode is over the surface of the n-type semiconductor layer, and the second electrode is over the surface of the exposed p-type semiconductor layer; a transparent medium layer over the upper surface of the epitaxial laminated layer, wherein, the upper surface is provided with a grid-shaped or array-shaped recess region; a patterned transparent bonding medium layer fills up the recess region of the transparent medium layer, and the upper surface is at the same plane with the upper surface of the transparent medium layer; and a transparent substrate connects the patterned transparent bonding medium layer to the upper surface of the transparent medium layer.

In some embodiments, a transparent medium layer is disposed over the upper surface of the epitaxial laminated layer, having a refractive index $n_1$ that is higher than 1.6.

In some embodiments, the lower surface of the n-type semiconductor layer is arranged with pyramid-shaped recess arrays, wherein, each pyramid-shaped recess is arranged in the vertical shadow area of the transparent bonding medium layer to reflect light from the vertical shadow area of the transparent bonding medium layer; as a result, light can deviate from this shadow area, thus eliminating light reflection from the transparent bonding medium layer to the inside part of the chip.

In some embodiments, the first electrode has high reflectivity, and reflects light from the active layer upwards as an electrode and a reflector.

In some embodiments, refractivity of the transparent medium layer is higher than or equal to that of the transparent substrate; the material can be any high-refractivity transparent material like titanium dioxide, aluminum oxide, ITO, silicon nitride or zinc oxide, and the thickness is 2-5 µm.

In some embodiments, the transparent medium layer is provided with grid-shaped or array-shaped recess region, wherein, the characteristic shape can be cylindrical (pillar) shape, multi-column (pillar) shape or pyramid shape, and the depth is 1-3 µm.

In some embodiments, the transparent substrate serves as a light-transmitting window, wherein, the upper surface is a polishing surface or a roughen surface.

According to a second aspect of the present disclosure, a fabrication method of a flip-chip light-emitting diode chip includes: 1) proving a growth substrate, and forming an n-type semiconductor layer, an active layer and a p-type semiconductor layer over the substrate in successive; 2) forming a transparent medium layer over the p-type semiconductor layer, wherein, the upper surface is provided with a grid-shaped or array-shaped recess region; 3) depositing a patterned transparent bonding medium layer over the transparent medium layer, which fills up the recess region of the high-transparency medium layer, and the upper surface is at the same plane with the upper surface of the transparent medium layer; 4) providing a transparent substrate, and connecting it to the patterned transparent bonding medium layer and the upper surface of the transparent medium layer via bonding technology; 5) removing the growth substrate, and exposing the n-type semiconductor layer; 6) etching part of the n-type semiconductor layer and the active layer to expose part of the p-type semiconductor layer; and 7) fabricating a first electrode over the exposed n-type semiconductor layer, and fabricating a second electrode over the exposed p-type semiconductor layer.

In some embodiments, in step 3), deposit the transparent bonding medium layer over the transparent medium layer and fine polish the surface till the transparent medium layer is exposed, hence the transparent bonding medium layer fills up the recess region of the transparent medium layer, and the upper surfaces of these two layers are at a same plane, and then polish the surfaces.

In some embodiments, step 5) also includes: arranging pyramid-shaped recess arrays over the surface of the exposed n-type semiconductor layer, wherein, each pyramid-shaped recess is arranged in the vertical shadow area of the transparent bonding medium layer to reflect light from the vertical shadow area of the transparent bonding medium layer; as a result, light can deviate from this shadow area, thus eliminating light reflection from the transparent bonding medium layer to the inside part of the chip.

The flip-chip light-emitting diode with a patterned transparent bonding layer according to the present disclosure can effectively improve light extraction efficiency and ensure bonding strength and yield.

According to a third aspect of the present disclosure, a light-emitting system comprising a plurality of flip-chip light-emitting diodes is provided. Each flip-chip light-emitting diode further includes an epitaxial laminated layer, having an upper surface and a lower surface opposite to each other. The epitaxial laminated layer further includes an n-type semiconductor layer, an active layer and a p-type semiconductor layer, wherein, part of the n-type semiconductor layer and the active layer are etched to expose part of the p-type semiconductor layer; a first electrode and a second electrode over the lower surface of the epitaxial laminated layer, wherein, the first electrode is over the surface of the n-type semiconductor layer, and the second electrode is over the surface of the exposed p-type semiconductor layer; a transparent medium layer over the upper surface of the epitaxial laminated layer, wherein, the upper surface is provided with a grid-shaped or array-shaped recess region; a patterned transparent bonding medium layer fills up the recess region of the transparent medium layer, and the upper surface is at the same plane with the upper surface of the transparent medium layer; and a transparent substrate connects the patterned transparent bonding medium layer to the upper surface of the transparent medium layer. The system can be used in the fields of lighting, signage, display, etc.

Other features and advantages of various embodiments of the present disclosure will be described in detail in the following specification, and it is believed that such features and advantages will become more obvious in the specification or through implementations of this disclosure. The purposes and other advantages of the present disclosure can be realized and obtained in the structures specifically described in the specifications, claims and drawings.

Figure 1:
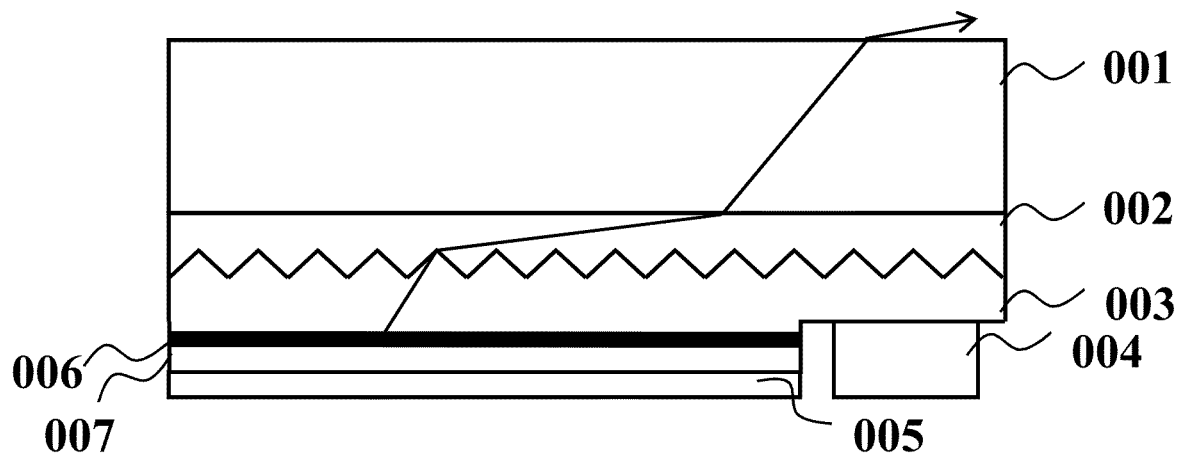
FIG. 1 illustrates a sectional view of a flip-chip light-emitting diode chip with a single-layer silicon dioxide bonding medium layer.

In the drawings: 001: sapphire substrate; 002: silicon dioxide transparent bonding layer; 003: p-type semiconductor layer; 004: second electrode; 005: first electrode; 006: active layer; 007: n-type semiconductor layer; 008: high-refractivity transparent medium layer; 009: pyramid-shaped recess array.

DETAILED DESCRIPTION

The present disclosure will be explained in details with reference to the accompanying drawings. Before further description, it should be understood, however, that various modifications and changes may be made to these embodiments. Therefore, the present disclosure is not limited to the embodiments below. It should also be noted that the scope of the present disclosure should still be subjected to the scope defined in the claims and the embodiments are merely for purposes of illustration, rather than restricting. Unless otherwise specified, all technical and scientific words shall have the same meanings as understood by persons skilled in the art.

With the adoption of a GaAs substrate, in red-light flip-chip light-emitting diodes, the epitaxial layer is generally required to be transferred to the transparent substrate via bonding technology. In general, the transparent transferring substrate is a sapphire substrate, whose thermal expansivity matches with that of GaAs materials. With high refractivity and transmittance, the transparent transferring substrate can serve as a light-transmitting window, and the bonding medium must be transparent medium. As a mature transparent bonding medium layer, silicon dioxide features high bonding strength and good yield. However, its low refractivity limits light extraction inside the semiconductor, thus restricting the function of the sapphire substrate as a light-transmitting window. As shown in FIG. 1, considering that a light beam is emitted to the sapphire substrate 001 with an incident angle infinitely approaching to 90° after entering the silicon dioxide bonding medium layer 002, the angle of emergence is still smaller than the total-reflection critical angle of the silicon dioxide/sapphire interface. After chip packaging, as refractivity of packaging material is close to that of the silicon dioxide, all light emitted from the silicon dioxide to the sapphire would be emitted from the sapphire substrate surface, with direction of emergence parallel to the direction of incidence. For this reason, it is actually equivalent to that the sapphire substrate does not exist. Light emitted from the light-emitting layer is equivalent to be directly emitted to the packaging material from the semiconductor, i.e., the sapphire substrate fails to function as a light-transmitting window. For this reason, light extraction efficiency in this structure is low. To solve the above problem, the most direct method is to use high-refractivity (larger than or equal to that of the sapphire substrate) transparent material as the bonding medium layer, such as aluminum oxide, titanium dioxide and ITO. In practice, however, the inventors of the present disclosure have recognized that bonding quality of these materials is far from that of silicon dioxide with low bonding strength and yield.

Figure 2:
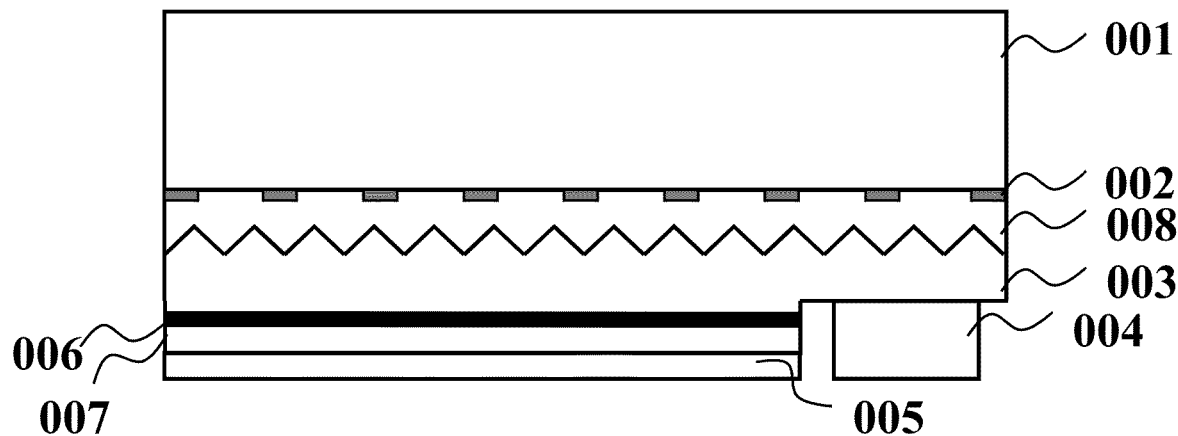
FIG. 2 illustrates a sectional view of a flip-chip light-emitting diode with a patterned transparent bonding layer according to some embodiments in the present disclosure.

Referring to FIG. 2, a preferred embodiment of the present disclosure provides a flip-chip light-emitting diode with a patterned transparent bonding medium layer, including from bottom to up, a first electrode, a second electrode, an epitaxial laminated layer, a high-refractivity transparent medium layer, a silicon dioxide transparent bonding layer and a transparent substrate.

Specifically, the epitaxial laminated layer at least includes an n-type semiconductor layer 007, an active layer 006 and a p-type semiconductor layer 003, wherein, some regions of the n-type semiconductor layer 007 and the active layer 006 at the chip edge are etched to expose the p-type semiconductor layer 003.

Cover a first electrode 005 over the etched n-type semiconductor layer 007, wherein, the first electrode 005 serves as the chip cathode and the reflector. In this embodiment, the material is Ag.

Provide a second electrode 004 over the exposed p-type semiconductor layer 003 after etching, which serves as the chip anode. The material is beryllium gold.

Figure 3:
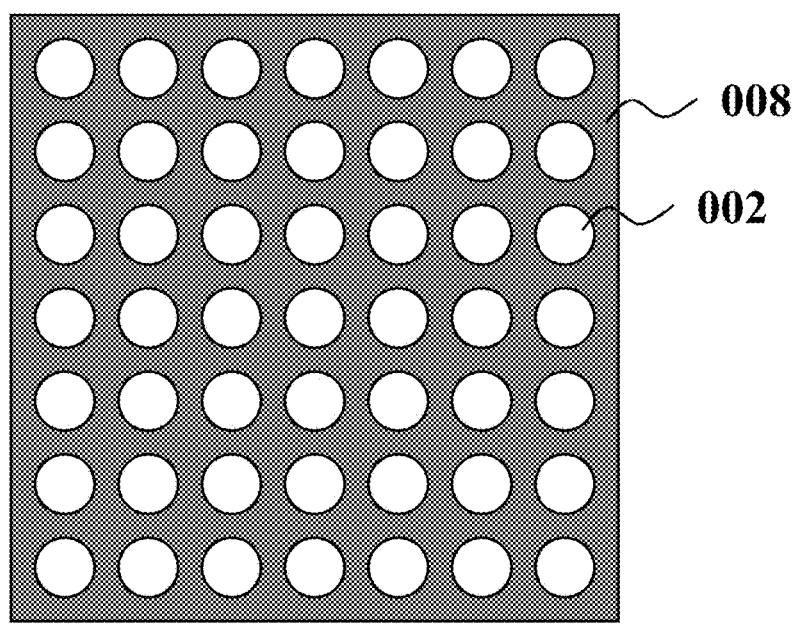
FIG. 3 illustrates a top-view diagram of the patterned transparent bonding layer.

Deposit a high-refractivity transparent medium layer 008 over the upper surface of the p-type semiconductor layer 003. In this embodiment, the material is aluminum oxide and has a thickness of 3 μm. Etch patterns over the upper surface. In this embodiment, define a circular array over the upper surface of the aluminum oxide via photoetching. Etch the area within the circle to form an array-shaped recess region, as shown in FIG. 3. In the circular array, circle diameter is 3-6 μm, circle center distance is 5-10 μm, and etching depth is 1-2 μm.

Deposit a silicon dioxide bonding medium layer 002 with thickness of 1-2 μm over the high-refractivity transparent medium layer 008. Then, fine polish the surface of the silicon dioxide bonding medium layer 002 till the high-refractivity transparent medium layer 008 is exposed.

Bond the above structure to the sapphire substrate 001, wherein, the sapphire substrate 001 is 100-200 μm thick and serves as a supporting substrate and a light-transmitting window.

Figure 4:
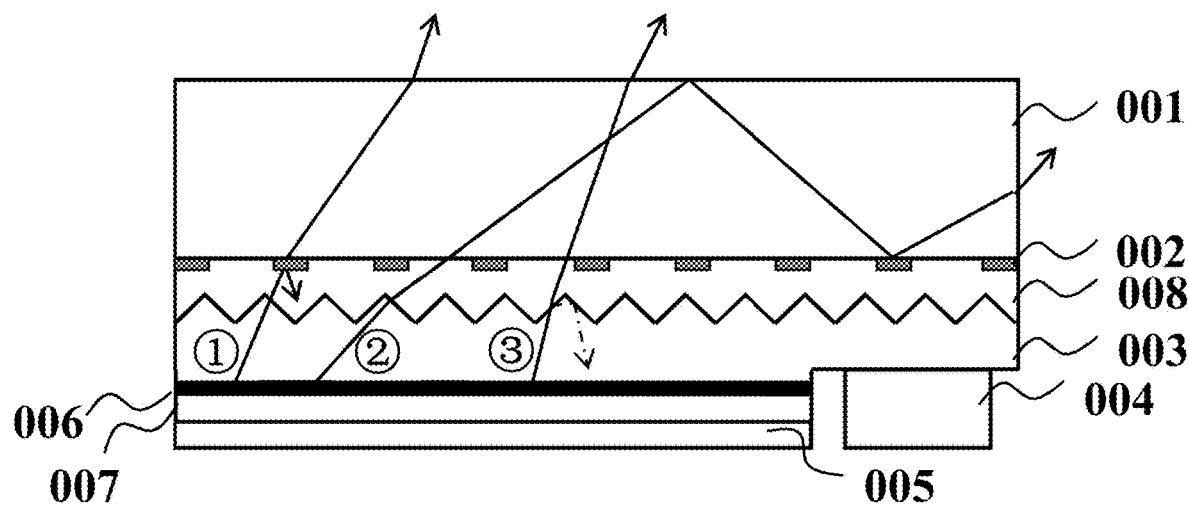
FIG. 4 shows an optical path analysis diagram showing the improvement of light extraction efficiency by the flip-chip light-emitting diode with a patterned transparent bonding layer according to some embodiments of the present disclosure.

As shown in FIG. 4, the light-emitting medium of the semiconductor surface is changed to high-refractivity transparent material, which greatly increases light extraction efficiency from the semiconductor to the sapphire substrate. Light emitted to the high-refractivity transparent medium is divided into two portions. Some light, such as light 1, is emitted to the silicon dioxide bonding medium layer, and reflection, refractivity or total reflection take place over the lower surface. This portion of light is similar to that of the original bonding structure; some light is directly emitted to the sapphire substrate through the high-refractivity transparent medium, which increases light into the sapphire substrate, and therefore increases probability of light extraction; for example, light 2 is totally reflected over the upper surface of the sapphire substrate. However, as the sapphire substrate is far thicker than the epitaxial layer, light is emitted from the side after repeated reflections inside for several times. In this way, the sapphire substrate functions as a transmittance window. In this case, the silicon dioxide transparent bonding medium layer also serves as a reflector, which patricianly reflects light back to inside part of the chip from the upper surface of the sapphire substrate to prevent it from being emitted to and absorbed by the semiconductor layer; for example, light 3 is directly emitted from the sapphire substrate (solid line), and light is reflected back to the inside part of the chip if a silicon dioxide transparent bonding medium layer is used (dotted line). To sum up, this embodiment provides a flip-chip light-emitting diode with a patterned transparent bonding layer, which effectively improves light extraction efficiency and guarantees bonding strength and yield.

Figure 5:
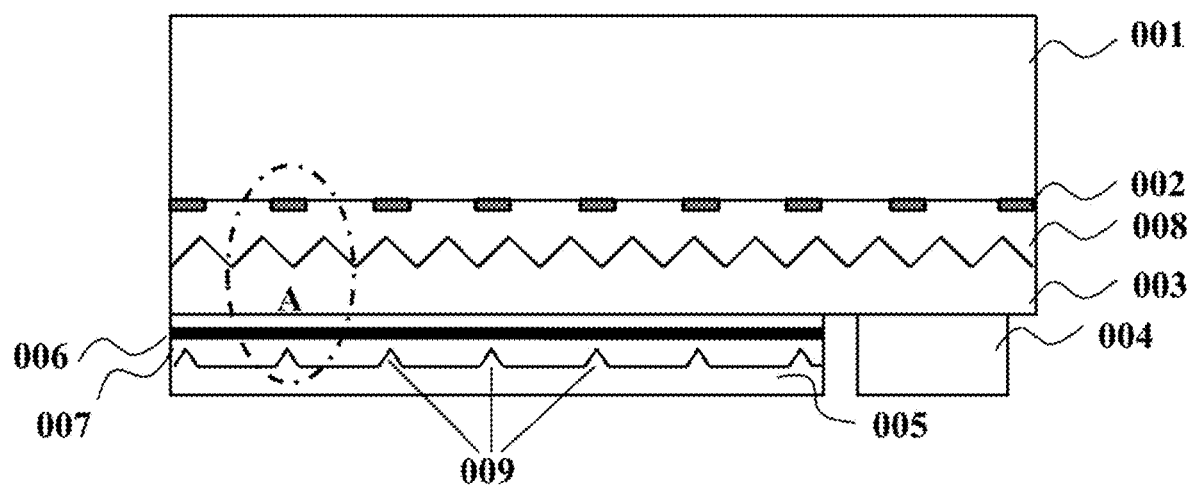
FIG. 5 shows the fabrication of a pyramid-shaped recess over the lower surface of the n-type semiconductor of the flip-chip light-emitting diode with a patterned transparent bonding layer according to some embodiments of the present disclosure.

Referring to FIG. 5, another flip-chip light-emitting diode with a patterned transparent bonding medium layer is provided. The lower surface of the n-type semiconductor layer 007 is etched to form pyramid-shaped recess arrays 009. Each pyramid-shaped recess corresponds to the vertical shadow area of the silicon dioxide bonding medium layer 002, and the diagonal length of the bottom surface is less than or equal to the diameter of the circular recess bottom layer of the silicon dioxide bonding medium layer 002.

Figure 6:
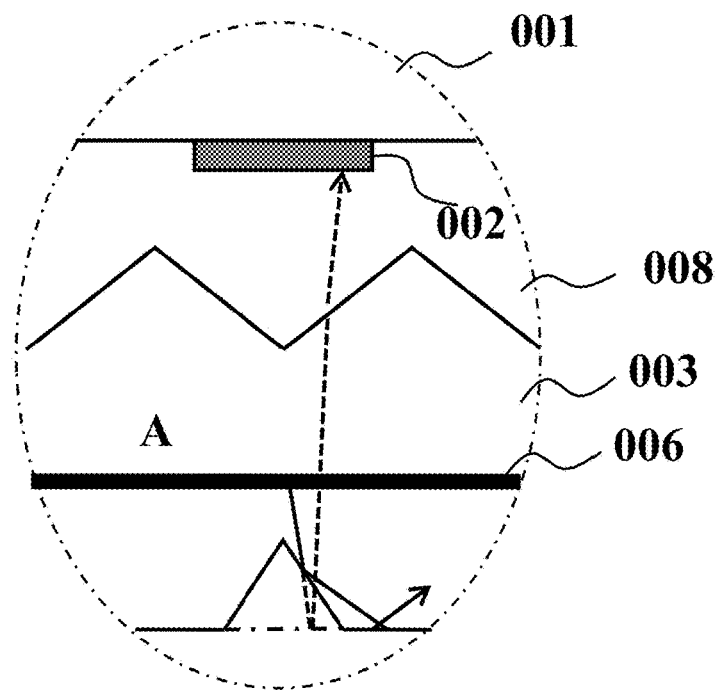
FIG. 6 shows that the pyramid-shaped recess of the lower-surface of the n-type semiconductor layer deviates light of the vertical shadow area of the silicon dioxide transparent bonding layer, which eliminates light reflection from the silicon dioxide transparent bonding layer to the inside part of the chip.

As shown in FIG. 6, the lower surface of the n-type semiconductor layer is arranged with pyramid-shaped recess arrays, wherein, each pyramid-shaped recess is arranged in the vertical shadow area of the silicon dioxide bonding medium layer to reflect light from the vertical shadow area of the silicon dioxide bonding medium layer; as a result, light can deviate from this shadow area, thus eliminating light reflection of the silicon dioxide bonding medium layer to the inside parts of the chip.

Figure 7:
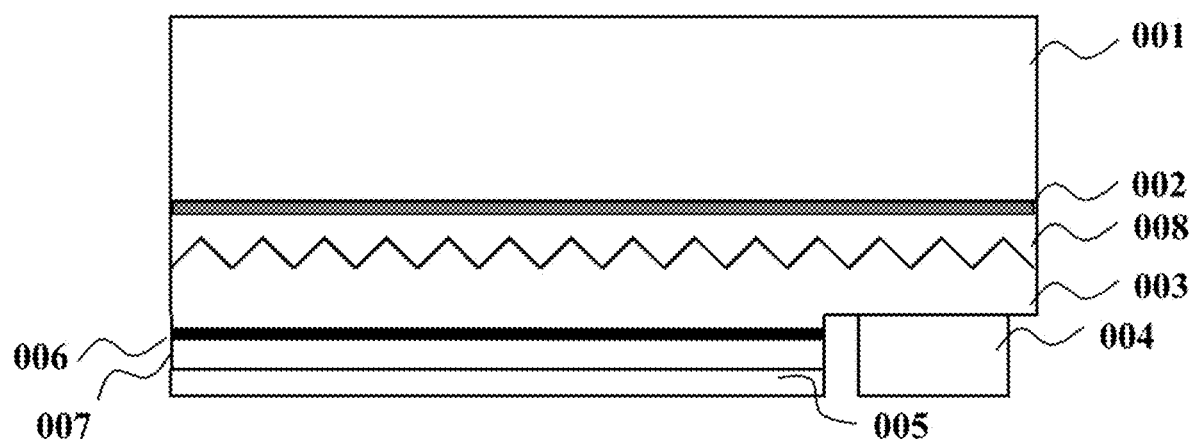
FIG. 7 illustrates a sectional view of a flip-chip light-emitting diode with a thin transparent bonding layer according to some embodiments in the present disclosure.

FIG. 7 illustrates a sectional view of a flip-chip light-emitting diode with a thin transparent bonding layer according to some embodiments of the present disclosure.

Different from the embodiments illustrated in FIG. 2, the transparent bonding medium layer 002 is a thin layer, with a thickness to realize an optimal light extraction efficiency.

For example, the transparent bonding medium layer 002 can have a thickness less than or equal to $\lambda/2n_2$, where $\lambda$ is a light wavelength of the active layer, $n_2$ is a refractive index of the transparent medium layer 002.

In some embodiments, the transparent bonding medium layer 002 can have a thickness of 50-250 nm, such as 50-150 nm. In an embodiment, the transparent bonding medium layer 002 can have a thickness of 100 nm. If thickness is too large, it may not be efficient for light extraction; if it is too thin, there may not be sufficient bonding strength.

In some embodiments, a transparent medium layer is disposed over the upper surface of the epitaxial laminated layer, having a refractive index $n_1$ that is higher than 1.6.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting diode (LED), comprising an epitaxial laminated layer with an upper surface and an opposing lower surface, the LED including:
    a first-type semiconductor layer;
    an active layer; and
    a second-type semiconductor layer;
    wherein:
    a portion of the first-type semiconductor layer and the active layer are etched to expose a portion of the second-type semiconductor layer;
    a first electrode and a second electrode are disposed over the lower surface of the epitaxial laminated layer;
    the first electrode is disposed over a surface of the first-type semiconductor layer;
    the second electrode is disposed over a surface of the exposed second-type semiconductor layer;
    a transparent medium layer over the upper surface of the epitaxial laminated layer, having a refractive index $n_1$ that is higher than 1.6;
    a transparent bonding medium layer over one upper surface of the transparent medium layer, having a refractive index $n_2$ that is lower than $n_1$; and
    a transparent substrate that connects the transparent bonding medium layer to the upper surface of the transparent medium layer.

2. The light-emitting diode of claim 1, wherein:
    a lower surface of the first-type semiconductor layer is arranged with pyramid-shaped recess arrays; and
    each pyramid-shaped recess of the pyramid-shaped recess arrays is arranged in a vertical shadow area of the transparent bonding medium layer to reflect light from the vertical shadow area of the transparent bonding medium layer, such that, light deviates from the vertical shadow area, thereby reducing or eliminating light reflection from the transparent bonding medium layer to an inside part of the chip.

3. The light-emitting diode of claim 1, wherein the transparent bonding medium layer has a thickness less than or equal to $\lambda/2n_2$, where $\lambda$ is a light wavelength of the active layer.

4. The light-emitting diode of claim 1, wherein the transparent medium layer comprises at least one of titanium dioxide, aluminum oxide, ITO, silicon nitride, or zinc oxide.

5. The light-emitting diode of claim 1, wherein the first electrode is configured to reflect light from the active layer upwards.

6. The light-emitting diode of claim 1, wherein $n_1$ is higher than or equal to a refractive index of the transparent substrate.

7. The light-emitting diode of claim 1, wherein the transparent bonding medium layer has a thickness of 50-150 nm.

8. The light-emitting diode of claim 1, wherein the transparent bonding medium layer has a thickness of 50-250 nm.

9. The light-emitting diode of claim 1, wherein the transparent substrate has a thickness of 100-200 μm.

10. The light-emitting diode of claim 1, wherein the transparent medium layer has a thickness of 2-5 μm.

11. The light-emitting diode of claim 1, wherein the transparent medium layer has a pattern in the upper surface, and the transparent bonding medium layer is filled the pattern of the transparent medium layer.

12. The light-emitting diode of claim 11, where an upper surface of the pattern of the transparent bonding medium layer is at a same plane with an upper surface of the transparent medium layer.

13. The light-emitting diode of claim 11, where the pattern of the transparent bonding medium layer comprises grid-shaped or array-shaped recesses.

14. The light-emitting diode of claim 13, wherein each of the recesses has a cylindrical pillar shape, a multi-column pillar shape, or a pyramid shape.

15. The light-emitting diode of claim 13, wherein each of the recesses has a depth of 1-3 μm.

16. A method of fabricating the LED of claim 1, wherein the first-type semiconductor layer is an n-type semiconductor layer, the second-type semiconductor layer is a p-type semiconductor layer; the method comprising:
1) proving a growth substrate, and forming the first-type semiconductor layer, the active layer and the second-type semiconductor layer over the growth substrate to thereby form the epitaxial laminated layer;
2) forming the transparent medium layer over the first-type semiconductor layer;
3) depositing the transparent bonding medium layer over the transparent medium layer;
4) providing the transparent substrate, and connecting it to the transparent bonding medium layer and the upper surface of the transparent medium layer via bonding technology;
5) removing the growth substrate, and exposing the first-type semiconductor layer;
6) etching part of the first-type semiconductor layer and the active layer to expose part of the second-type semiconductor layer; and 7) fabricating a first electrode over the exposed first-type semiconductor layer; and fabricating a second electrode over the exposed second-type semiconductor layer.

17. The method of claim 16, wherein step 3) further comprises:
depositing the transparent bonding medium layer over the transparent medium layer;
fine-polishing the surface till the transparent medium layer is exposed, wherein, the transparent bonding medium layer fills up recess regions of the transparent medium layer, and upper surfaces of these two layers are at a same plane;
wherein step 5) further comprises:
arranging pyramid-shaped recess arrays over the surface of the exposed first-type semiconductor layer, wherein, each pyramid-shaped recess is arranged in the vertical shadow area of the transparent bonding medium layer to reflect light from the vertical shadow area of the transparent bonding medium layer; and
as a result, light deviates from this shadow area, thereby eliminating light reflection from the transparent bonding medium layer to the inside part of the chip.

18. A light-emitting system comprising a plurality of flip-chip light-emitting diodes, wherein each flip-chip LED comprises:
an epitaxial laminated layer having an upper surface and an opposing lower surface, and comprising:
a first-type semiconductor layer;
an active layer; and
a second-type semiconductor layer;
wherein:
a portion of the first-type semiconductor layer and the active layer are etched to expose a portion of the second-type semiconductor layer;
a first electrode and a second electrode are disposed over the lower surface of the epitaxial laminated layer;
the first electrode is disposed over a surface of the first-type semiconductor layer;
the second electrode is disposed over a surface of the exposed second-type semiconductor layer;
a transparent medium layer over the upper surface of the epitaxial laminated layer, having a refractive index $n_1$ that is higher than 1.6;
a transparent bonding medium layer over an upper surface of the transparent medium layer, having a refractive index $n_2$ that is lower than $n_1$; and
a transparent substrate that connects the transparent bonding medium layer to the upper surface of the transparent medium layer.

19. The system of claim 18, wherein:
$n_1$ is higher than or equal to a refractive index of the transparent substrate;
the transparent bonding medium layer has a thickness less than or equal to $\lambda/2n_2$, where $\lambda$ is a light wavelength of the active layer;
the transparent medium layer has a pattern at an upper surface, and the transparent bonding medium layer is filled the pattern of the transparent medium layer; and
the upper surface of the pattern of the transparent bonding medium layer is at a same plane with an upper surface of the transparent medium layer.

20. The system of claim 19, wherein the first electrode is configured to reflect light from the active layer upwards, and wherein the transparent bonding medium layer has a thickness of 100 nm.

* * * * *